United States Patent [19]

Aketagawa et al.

[11] Patent Number: 5,234,862
[45] Date of Patent: Aug. 10, 1993

[54] THIN FILM DEPOSITION METHOD

[75] Inventors: Ken-ichi Aketagawa; Junro Sakai, both of Fuchu; Toru Tatsumi, Tokyo; Shun-Ichi Murakami; Hiroyoshi Murota, both of Fuchu, all of Japan

[73] Assignees: Anelva Corp.; NEC Corp., Tokyo, Japan

[21] Appl. No.: 756,573

[22] Filed: Sep. 9, 1991

[30] Foreign Application Priority Data

Sep. 21, 1990 [JP] Japan .................. 2-253002

[51] Int. Cl.⁵ .................. H01L 21/20; H01L 21/203
[52] U.S. Cl. .................. 437/103; 437/105; 437/106; 118/724
[58] Field of Search .............. 437/103, 228, 105, 106; 118/724

[56] References Cited

U.S. PATENT DOCUMENTS

| | | | |
|---|---|---|---|
| 4,137,865 | 2/1979 | Cho ..................... | 118/49.1 |
| 4,829,021 | 5/1989 | Fraas et al. ............ | 437/81 |
| 5,154,773 | 10/1992 | Furusawa ............... | 118/724 |
| 5,160,545 | 11/1992 | Maloney et al. ........ | 118/724 |

FOREIGN PATENT DOCUMENTS

| | | |
|---|---|---|
| 0305195 | 3/1989 | European Pat. Off. . |
| 0382988 | 8/1990 | European Pat. Off. . |
| 1555010 | 1/1969 | France . |
| 2162206 | 1/1986 | United Kingdom . |

OTHER PUBLICATIONS

M. Ishida et al., *Journal of Applied Physics,* 64(4) 2087-2091 (Aug. 15, 1988).
H. Hirayama et al., *Applied Physics Letters,* 56(12) 1107-1109 (Mar. 19, 1990).
Patent Abstracts of Japan, 7(236) (E-205) (1381) (Oct. 20, 1983).

*Primary Examiner*—Olik Chaudhuri
*Assistant Examiner*—Ramamohan Rao Paladugu
*Attorney, Agent, or Firm*—Wenderoth, Lind & Ponack

[57] ABSTRACT

A thin film deposition method consists of depositing a thin film on a wafer by supplying a reactant gas molecules toward and onto the wafer within a vacuum vessel or chamber. The pressure within the vacuum vessel is set to the pressure under which the mean free path (d) of the molecules contained in the supplied reactant gas can be longer than the shortest distance (L) between the wafer and the wall of the vacuum vessel exposed to the vacuum side, or d>L. The temperature of the wafer is set to the temperature (T sub) at which the reactant gas can cause substantially the thermally decomposing reaction. The temperature of the vacuum side-exposed wall of the vacuum vessel (T wall) is set to a temperature range having the lower limit higher than the temperature (T vap) at which the saturated vapor pressure can be maintained to be equal to the partial pressure of the molecules contained in the reactant gas, and having the upper limit lower than the temperature of the wafer (T sub), or T vap<T wall<T sub.

28 Claims, 12 Drawing Sheets

θ = 110.2°

THIN FILM DEPOSITION METHOD

BACKGROUND OF THE INVENTION

1. Field of the Invention

The present invention relates to a thin film deposition method, and, in particular, to the process for depositing a thin film on a wafer in a vacuum chamber or vessel where any reactant gas is supplied and a thin film is deposited on the wafer under the pressure range in which the molecules in the supplied gas will have no reaction interaction upon each other in their vapor phase.

2. Description of the Prior Art

There is a conventional thin film deposition method which is known as the "gas source epitaxial growth" process. In this process, a vacuum chamber or vessel has its inner wall covered with a shroud, and is internally placed under the liquid nitrogen, allowing the shroud to be cooled to the liquid nitrogen temperature. The molecules in the reactant gas from its source are diffusing as it is introducing into the vacuum chamber, and the major part of those molecules may be attracted toward the inner wall and absorbed on the shroud. During the epitaxial growth process, therefore, only the small remaining part of the molecules in the reactant gas can be flying across the space directly from the source, such as gas nozzle and other gas sources, onto the wafer surface. In this specification, this part of the molecules will be referred to hereinafter as "primary molecules".

The primary molecules which are traveling from the gas source onto the wafer surface may usually have a sticking coefficient of less than 10%. It is noted that the gaseous molecules from the source are diffusing according to the cosine law just after they have been introduced into the vacuum chamber, and the proportion of the gaseous molecules that can be flying onto the wafer surface is equal to 10% to 20% of the total gaseous molecules that have been supplied from the source.

It may be understood from the above description that the conventional thin film deposition method cannot utilize the reactant gas effectively during the epitaxial growth process, whose utilization is only equal to several percent of the total reactant gas.

It has been described that the reactant gas supplied from its source is diffusing according to the cosine law as described above. Similarly, when a thin film is being deposited on the wafer surface during the epitaxial growth process, it may also be influenced by the above cosine law in such a way that the film thickness distribution is affected. It is thus difficult to provide the uniform film thickness distribution across the wafer.

SUMMARY OF THE INVENTION

The present invention overcomes the above described problems by improving the utilization of the reactant gas. It is accordingly an object of the present invention to provide a thin film deposition method that provides a uniformly distributed thickness when a thin film is deposited on a wafer surface.

In order to achieve the above object, the present invention allows the molecules in the reactant gas to be diffused, without being absorbed by the inner wall of the vacuum chamber or vessel, when the molecules are traveling across the space toward the wafer being deposited.

The thin film deposition method according to the present invention consists of depositing a thin film on a wafer within a vacuum vessel or chamber by supplying reactant gas molecules for depositing the thin film on the wafer, wherein the method includes maintaining the vacuum vessel or chamber under the pressure range within which no reaction will substantially occur in the supplied reactant gas molecules in the vapor phase, and controlling the temperature of the wall of the vacuum vessel exposed to the vacuum side to be maintained within the temperature range that has the lower limit temperature at which the saturated vapor pressure of the supplied gas molecules is higher than its partial pressure, and the upper limit temperature lower than that of the wafer being heated.

The temperature control for the wall of the vacuum vessel exposed to the vacuum side may be provided in two ways. For one, the temperature of the vacuum vessel wall itself maybe controlled directly by using any heating or cooling means. For the other, a shroud may be provided along the inner wall of the vacuum vessel, through which a fluid (such as liquid nitrogen) may circulate, thereby controlling the temperature of the wall.

The latter way provides a simpler means of controlling the temperature of the wall of the vacuum vessel exposed to the vacuum side, and is more commonly used.

The pressure range should be maintained so that the supplied reactant gas molecules don't react substantially in vapor phase, that is, the pressure range within which it is more probable that the supplied reactant gas molecules may strike or collide against the inner wall of the vacuum vessel (the wall exposed to the vacuum side) or the wafer, rather than the gas molecules collide each other within the vacuum vessel. In this pressure range, the probability of the supplied gas molecules striking against the wafer or the inner wall of the vacuum vessel is by far greater than that of the molecules colliding against each other, and therefore the probability of the molecules exchanging thermal energy between each other is far smaller. Thus, the molecules can only exchange thermal energy with the wafer or the inner wall. The smaller probability of the molecules exchanging between each other means the smaller thermal conduction of the molecules in the vapor phase. Under such conditions, the molecules may receive thermal energy enough to allow them to cause thermal decomposing reaction (pyrolysis) from the wafer or the inner wall, but the smaller thermal conduction in the vapor phase cannot cause the thermal decomposing reaction (pyrolysis) in the overall vapor phase. This means that the reaction in the vapor phase cannot occur in the space within the vacuum vessel. Now, if the temperature of the inner wall is set to the temperature such that it cannot cause the thermal decomposing reaction (pyrolysis) in the reactant gas, it will only cause the thermal decomposing reaction (pyrolysis) on the surface of the wafer. As a result, a thin film may be deposited by causing the thermal decomposing reaction (pyrolysis) on the wafer surface only. In order to provide the pressure range within which substantially no reaction in the vapor phase will occur, the optimum way is to set the pressure in the vacuum vessel such that the mean free path of the reactant gas molecules is longer than the shortest distance between the wafer and the inner wall of the vacuum vessel. That is, the following equation must be satisfied:

$$d > L \tag{1}$$

where d is the mean free path of the reactant gas molecules, and L is the shortest distance between the wafer and the inner wall. To conform the condition of the above equation, the reactant gas molecules in the vapor phase cannot cause any thermal decomposing reaction (pyrolysis). This may be explained by the fact that when the molecules have received thermal energy from the wafer upon striking against the latter, some of the collided molecules may be reflected from the wafer (secondary molecules), but it is less probable that those secondary molecules will collide against each other, but rather it is more probable that they will strike against the inner wall of the vacuum vessel, because the mean free path of the molecules is longer than the shortest distance between the wafer and the inner wall.

In order to ensure that the reactant gas molecules don't collide each other within the vacuum vessel, it is possible that the distance between the gas source and the wafer may also be shorter than the mean free path of the reactant gas molecules. By setting the distance between the gas source and the wafer in this way, the reactant gas molecules directly supplied from the gas source (primary molecules) will not collide against each other, and therefore it is more probable that those molecules can directly reach the wafer.

The only factor to be considered here is, however, the probability that the molecules given the thermal energy sufficient to cause the thermal decomposing reaction (pyrolysis) will collide each other. It is not necessary to consider, therefore, that those molecules which have been supplied from the gas source but have not yet ben given the thermal energy to cause the thermal decomposing reaction (pyrolysis) may possibly strike against each other. Thus, the only consideration is that the condition as specified by the above equation (1) should be satisfied.

What is next discussed is that by setting the temperature of the wall of the vacuum vessel exposed to the vacuum side (inner wall) to be temperature at which the vapor pressure can be maintained above the partial pressure of the supplied reactant gas molecules in the vapor phase, it is possible to ensure that the reactant gas molecules are not adsorbed on the inner wall (vacuum side-exposed wall).

Usually, the vapor pressure and temperature of a substance have the relationship as represented graphically in FIG. 6. The temperature at which a given vapor pressure can be maintained is the temperature that corresponds to that saturated vapor pressure along the saturated vapor pressure curve in FIG. 6. If there is a drop in the temperature, there is the corresponding drop in the saturated vapor pressure that can be maintained, as clearly seen from the curve in FIG. 6. Any drop in the saturated vapor pressure means that the molecules flying in the vapor phase tend to be adsorbed on the inner wall that causes the corresponding drop in the temperature. If the temperature of the inner wall drops below the temperature along the saturated vapor pressure curved corresponding to the partial pressure of the reactant gas in the vapor phase, the molecules will tend to be adsorbed on the inner wall. Then, by setting the temperature of the vacuum side-exposed wall of the vacuum vessel to the temperature at which the saturated vapor pressure corresponding to the partial pressure of the reactant gas in the vapor phase, it is possible to ensure that the reactant gas molecules flying toward the wall are not adsorbed on the wall. By so doing, the reactant gas molecules can diffuse upon striking against the wall. When the reactant gas contains a mixture of several different gases, the temperature of the wall must be set to above the temperature at which the respective partial pressures of those different gases can be maintained.

Another consideration is that the temperature of the vacuum side-exposed wall of the vacuum vessel must be maintained below the temperature of a wafer. The temperature of a wafer should be set to the temperature at which the reactant gas molecules can cause the thermal decomposing reaction (pyrolysis) which can deposit a thin film on the wafer. If the temperature of the wall should rise above the temperature of the wafer, the reactant gas molecules flying toward the wall will cause the thermal decomposing reaction (pyrolysis) upon striking against the wall, and a thin film will be deposited on the wall. Thus, the utilization of the reactant gas will be reduced. Further, even if the reactant gas molecules may not thermally decompose and are reflected from the wall, the reflected molecules (secondary molecule) may diffuse as they retain the potential thermal energy enough to cause the thermal decomposing reaction. It is actually possible that the molecules may cause the reaction in the vapor phase.

From the above aspects, the temperature of the inner wall must be below the temperature at which the reactant gas molecules would cause substantially no decomposing reaction.

It may be concluded from the above considerations that the temperature of the vacuum side-exposed wall of the vacuum vessel should be higher than the temperature at which the saturated vapor pressure equal to the partial pressure of the reactant gas could be maintained and should be in the temperature range that is lower than the temperature of the wafer. Specifically, those requirements may be expressed by the following equation:

$$T_{vap} < T_{wall} < T_{sub} \tag{2}$$

where,
  $T_{vap}$ is the temperature of the saturated vapor pressure of the reactant gas;
  $T_{sub}$ is the temperature of the wafer;
  $T_{wall}$ is the temperature of the vacuum side-exposed wall.

According to the thin film deposition method of the present invention, part of the reactant gas molecules supplied from the gas source is traveling directly toward the wafer. Some of the molecules that have reached the wafer will contribute to the thin film growth, and others that have not contributed to the growth will be flying back into the space within the vacuum vessel. As described, the molecules from the gas source are diffusing according to the cosine law, and several ten percents of those molecules may be traveling elsewhere other than the wafer. Those molecules which are traveling toward the inner wall strike against the inner wall, from which they are diffused. Some of the diffused molecules are traveling toward the wafer. According to the conventional method, all of those molecules that have reached the inner wall are adsorbed by the liquid nitrogen-cooled shroud. According to the present invention, those molecules are all diffusing, and can be utilized fully to allow the reactant gas to promote the epitaxial growth on the wafer.

It should also be noted that the molecules flying toward the wafer includes the molecules from the gas source and governed by the cosine law (primary molecules) and the molecules diffused from the inner wall of the vacuum vessel (secondary molecules). Thus, the uniformity of the thickness distribution across a thin film formed on the wafer surface can be improved.

BRIEF DESCRIPTION OF THE DRAWINGS

Those and other objects, features, and advantages of the present invention will become more apparent from the detailed description of several preferred embodiments that follows with reference to the accompanying drawings, in which.

DESCRIPTION OF THE PREFERRED EMBODIMENTS

In a first preferred embodiment, the present invention that may be applied to the silicon gas source epitaxy using a disilane ($Si_2H_6$) gas is described.

Figure 1:
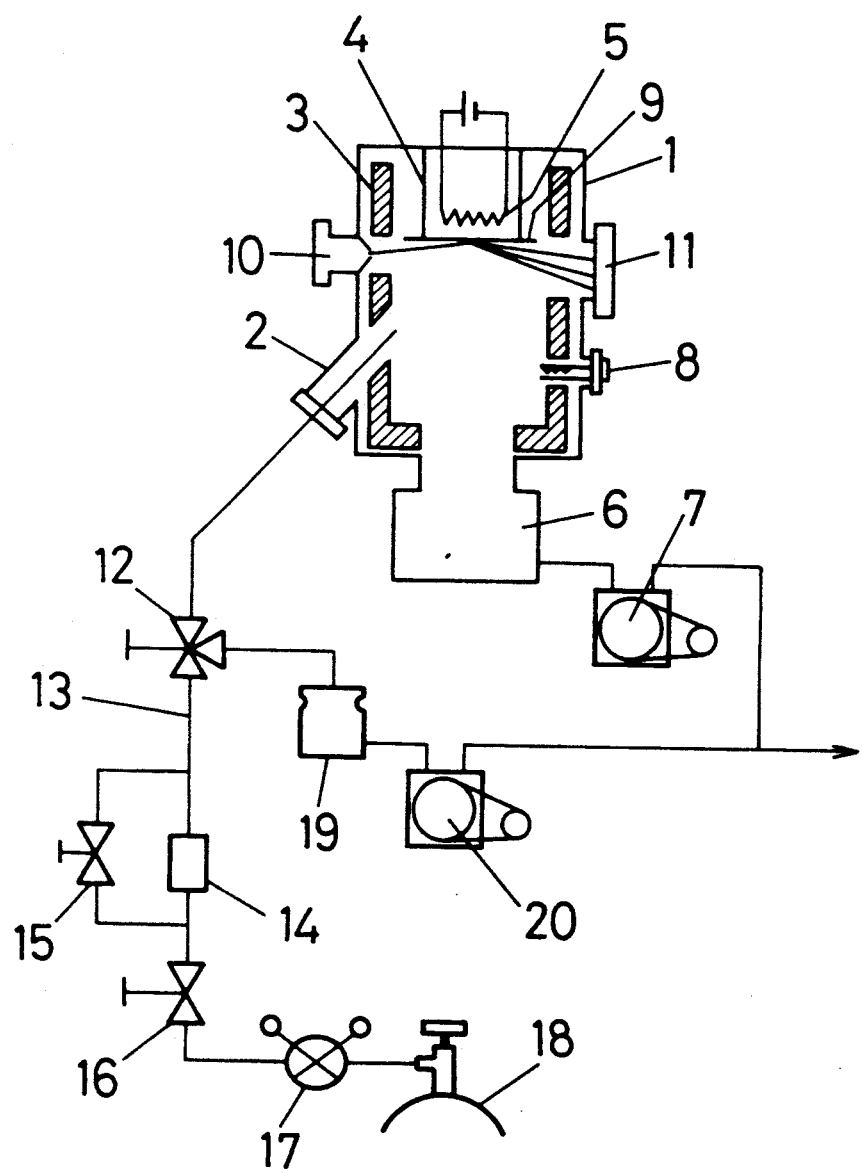
FIG. 1 illustrates the schematic diagram of a preferred embodiment of the apparatus according to the present invention.

Referring to FIG. 1, there is schematically shown the general arrangement of the apparatus that may be used in the first embodiment. It should be understood that the dimensions, geometrical configurations, and the relative positions of the component parts or elements which comprise the apparatus are only shown to help understand the concept and features of the present invention. As seen from FIG. 1, there is a vacuum chamber or vessel 1 in which a gas nozzle 2 is provided, a shroud 3 is arranged along the inner wall of the vacuum vessel 1, a wafer holder 4 is disposed above the space delimited by the shroud 3, and a heater 5 is disposed to face opposite the wafer holder 4.

Below the vacuum vessel 1, there are a turbo molecular pump 6 (which has a pumping speed of 1000 liters/sec.) connected to the vacuum vessel 1, and an auxiliary oil sealed rotary pump 7. These evacuate the vacuum vessel 1 to ultra high vacuum. A nude ion gauge 8 is mounted through the lateral wall of the vacuum vessel 1, and measures the pressures within the vacuum vessel 1. There is also an RHEED (Reflection High Energy Electron Diffraction) system that includes an electron gun 10 and a screen 11 and may be used for observing the surface conditions of a wafer 9 on the wafer holder 4.

The gas nozzle 2 is connected by way of a three-way valve 12 to a gas inlet system 13. The gas inlet system 13 includes a mass flow controller 14, valves 15, 16, and a regulator 17 which are connected as shown, the regulator 17 being connected to a gas container (which contains a disirane gas). The three-way valve 12 provides three ways, one of which is connected to an exhaust system that includes a turbo molecular pump 19 and an auxiliary oil-sealed rotary pump 20. The exhaust system removes any residual gas from the conduits in the gas inlet system. Therefore, the vacuum vessel can also evacuate the gas inlet system.

The following is provided to describe how the silicon epitaxial growth process occurs on a wafer 9 on its holder 4, by using the apparatus described above.

The pressure in the vacuum vessel or chamber 1 may be measured by the nude ion gauge 8, and the temperature of the wafer 9 may be detected by a thermo couple which is not shown to be disposed between the wafer holder 4 and the wafer 9 thereon. The vacuum vessel is evacuated by the turbo molecular pump 6 and then the back-ground pressure of less than $2.0 \times 10^{-9}$ Torr was attained. The flow rate of $Si_2H_6$ may be controlled by the mass flow controller 14 in the gas inlet system 13, and then it may be supplied onto the wafer 9 through the gas nozzle 2. The shroud 3 may be cooled by circulating either liquid nitrogen or water. When the flow rate of $Si_2H_6$ is varied between 1 and 30 sccm, the pressure is varied between about $2 \times 10^{-6}$ and about $5 \times 10^{-5}$ Torr for the liquid nitrogen-cooled shroud, and the pressure is varied between about $6 \times 10^{-5}$ and about $1.5 \times 10^{-3}$ Torr for the water-cooled shroud. When the flow of $Si_2H_6$ is switched by the three-way valve 12 so that it is not supplied onto the wafer 9, the turbo molecular pump 19 is then operated to remove any gas remaining in the conduits. For example, the turbo molecular pump 19 evacuates $Si_2H_6$ gas flown from the valve 12. A wafer 9 is a four-inch silicon wafer, of which surface facet is (001), having a particular pattern made by $CVDS_1O_2$, and may previously be rinsed using boiled etching solution ($H_2O:H_2O_2:NH_3OH = 20:6:1$). After this, the wafer may be placed on its holder 4. Then, the wafer may be thermally cleaned down at 850° C. for ten minutes within the vacuum vessel 1. After cleaning the wafer, the temperature of the wafer may be adjusted to growth temperature of 700° C., and the source gas of $Si_2H_6$ was supplied to be adjusted the pressure within the vacuum vessel 1 to about $1.5\times10^{-3}$ Torr, under which epitaxial Si may be grown, selectively. After the growth, the oxyde layer is removed from the thin film by using hydrofluoric acid (HF) solution, and the epitaxial Si thin film is decided to measuring a step height.

Figure 2:
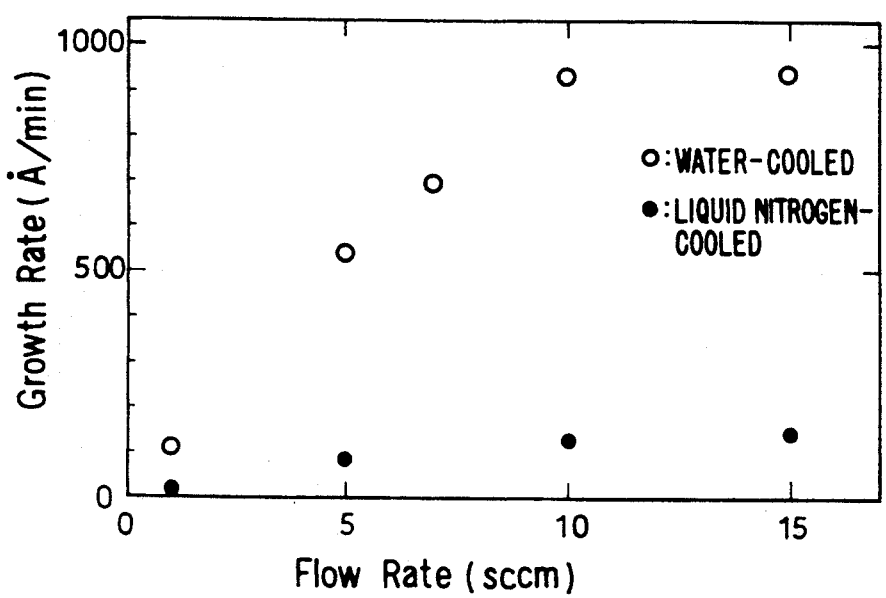
FIG. 2 is a graphical representation that explains the dependence of the growth rate upon the reactant gas flow rate in the embodiment of FIG. 1.

FIG. 2 shows $Si_2H_6$ gas flow rate dependent on the Si growth rate. In FIG. 2, ○ indicates the dependence when the shroud 3 is cooled by water, and ● indicates the dependence when the shroud 3 is cooled by liquid nitrogen.

When the water-cooled shroud is used, the growth rate is ten times as high as that when the liquid nitrogen-cooled shroud is used. ○ shows that the growth rate is constant regardless of the flow rate of above 10 sccm. This is because the growth rate is limited by the surface reaction speed. For the water-cooled shroud, the growth rate is tem times as high as that for the liquid nitrogen-cooled shroud. More clearly, this may be explained by the fact that for the liquid nitrogen-cooled shroud, it tends to adsorb the gas molecules whereas for the water-cooled shroud, it does not adsorb any source gas molecules but instead allows the gas molecules to diffuse on the surface of the shroud 3, flying again toward and onto the wafer 9 thereby contributing greatly to the growth rate.

Figure 3:
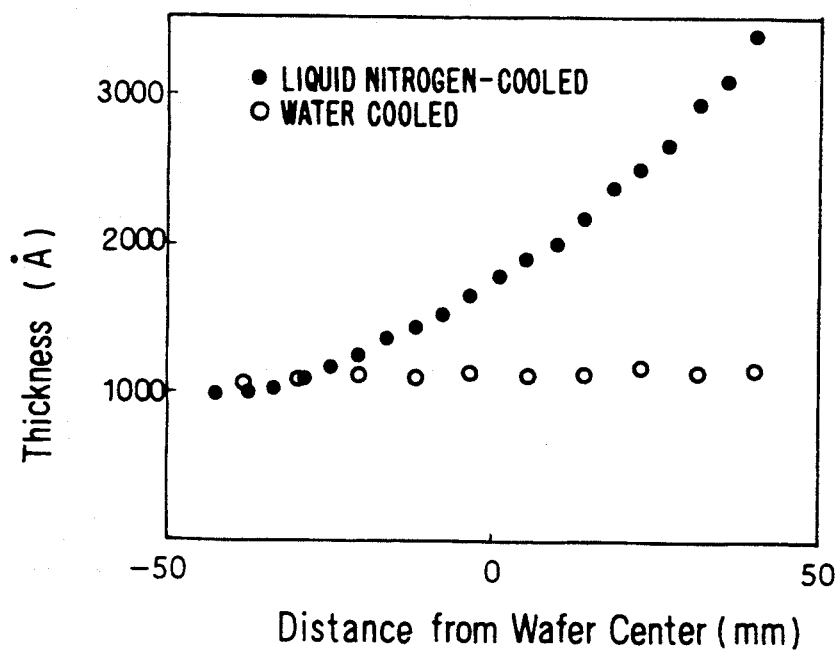
FIG. 3 is a graphical representation showing the distribution of the thin film thickness formed on a wafer in the embodiment of FIG. 1.

FIG. 3 illustrates the distribution of the film thickness formed into the wafer. ○ indicates the distribution of the film thickness obtained using the water-cooled shroud, and ● indicates the distribution of the film thickness obtained using the liquid nitrogen-cooled shroud. For both cases, the wafer 9 is completely stationary during the growth process. For the liquid nitrogen-cooled shroud, the distribution reflects the distribution of the molecule flow directly from the gas nozzle 2 that must be governed by the cosine law. For the water-cooled shroud, however, the distribution of the formed film thickness can be made uniform because in addition to the molecule flow directly from the gas nozzle 2, those molecules which are diffused against the wall of the vacuum vessel 1 exposed to the vacuum side, or the inner wall of the shroud 3, and are then flying toward the wafer can also contribute to the growth rate.

Figure 4A:
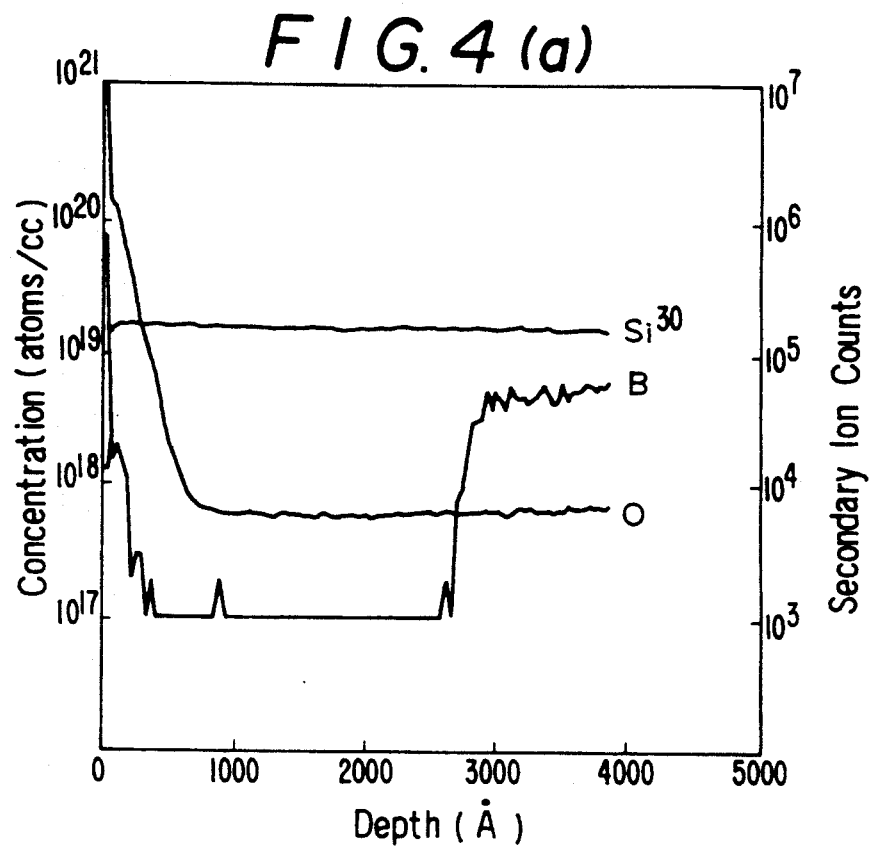
FIG. 4 (a) and (b) are diagrams showing the SIMS-analyzed spectrums (depth profile) for the epitaxial growth film, in which (a) shows the spectrums when the water-cooled shroud is used, and (b) shows the spectrums when the liquid nitrogen-cooled shroud is used.
Figure 4B:
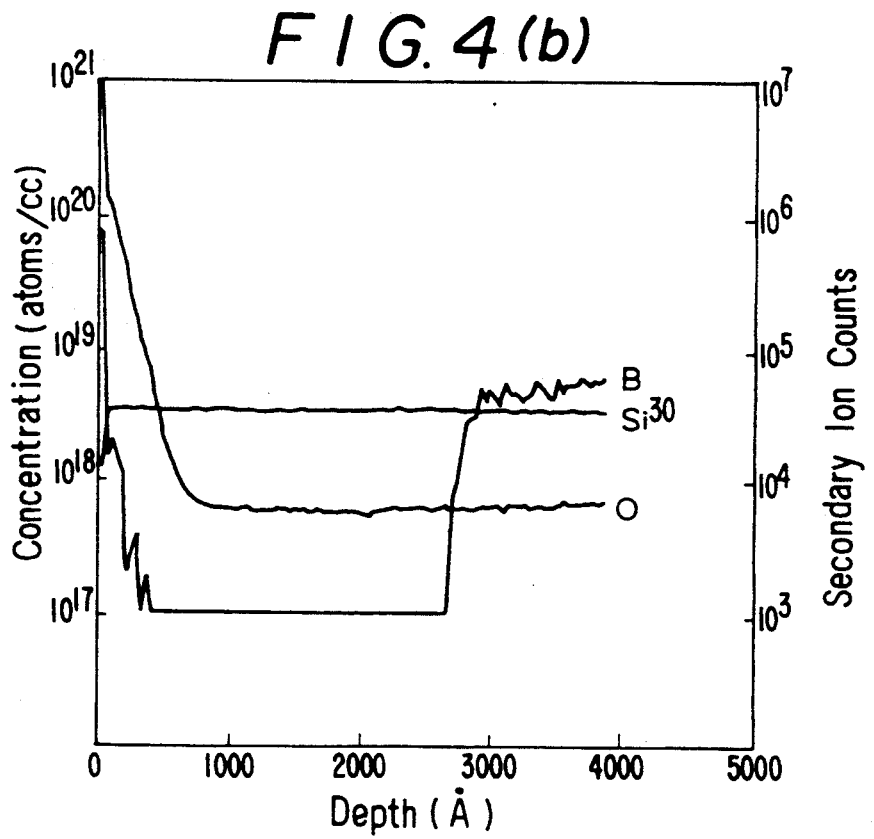

FIG. 4 (a) shows the results that have been obtained from the SIMS (Secondary Ion Mass Spectrometry) analysis of the Si epitaxial film formed when the water-cooled shroud is used, and FIG. 4 (b) shows the similar results for the liquid nitrogen-cooled shroud. B (boron) marks the interface between the wafer and epitaxial film. Both have the oxygen concentration level below the background behind the SIMS analyzer. It is known to any person skilled in the art that the liquid nitrogen-cooled shroud provides an absorbing effect for any impurity molecules (which contain components of 0 atoms, such as $H_2O$, $CO_2$) within the vacuum chamber. It has been discovered that the water-cooled shroud provides high-quality epitaxial film (which contains no impurity molecules) equivalent to that provided by the liquid nitrogen-cooled shroud, if the vacuum chamber is sufficiently baked prior to the film deposition process. The results shown in FIG. 4 (a) are those obtained in the embodiment where the chamber was sufficiently baked.

In the embodiment shown in FIG. 4 (a), the shroud 3 is cooled by circulating water (utilities water) or liquid nitrogen (which is filled and added as required later). As it is expected that the temperature of either of those circulating fluids may remain constant, no particular means is provided for controlling the temperature. Any suitable heat exchanger may be connected to the shroud 3 so that the temperature can remain constant, if the temperature should vary during the operation.

In this embodiment, the shortest distance between the wafer 9 and the vacuum side-exposed wall (the inner side of the shroud 3) is set to 40 mm.

Now, the preceding equation (1) will be mentioned again to check that the embodiment described above meets the requirements as specified by the equation (1).

In general, the mean free path d (m) for molecules may be found from the following expression:

$$d = 3.11 \times 10^{-24} \times \frac{T}{P \cdot D^2} \quad (3)$$

where,
T is the temperature of the gas (K);
P is the pressure (Pa);
D is the diameter of a molecule (m).

Figure 5:
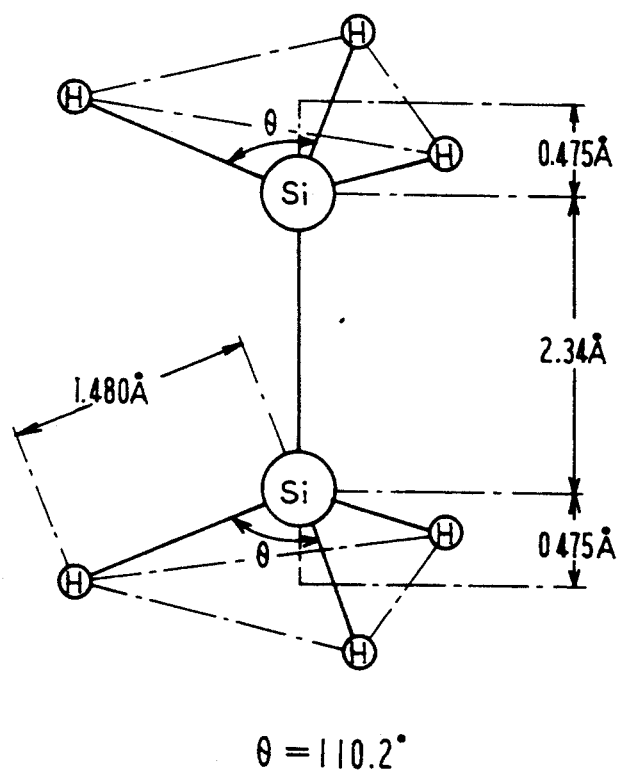
FIG. 5 illustrates a molecular structure model for disilane gas.

Then, the mean free path for $Si_2H_6$ gas molecules may be found by using the above equation (3). When the diameter D for each of $Si_2H_6$ gas molecules is found, the molecule structure model as shown in FIG. 5 may be used. This model is built to provide the distance between Si atoms of 2.34 Å and the distance between Si atom and H atom of 1.480 Å. It may be seen that the triangular pyramid formed by one Si atom and three H atoms has an apex $\theta$ of 110.2°. Therefore, the height of this triangular pyramid may be obtained from the above. The result will be 0.475 Å.

The diameter D between $Si_2H_6$ molecules may be found from (distance between Si atoms)+2 (height of the triangular pyramid). The result will be D=3.29 Å, i.e. $3.29\times10^{-10}$ m.

Then, the terms in the equation (3) is substituted by T=298K (assuming the room temperature of 25° C.) and $P=1.5\times10^{-3}$ Torr=0.1995 Pa, respectively. The mean free path for the $Si_2H_6$ may be obtained as follows:

$$d=42.9\times10^{-3} \text{ m}=42.9 \text{ mm}$$

L=40 mm, therefore it is found that d>L as required by the equation (1) is satisfied.

From this, the pressure within the vacuum vessel 1 will have been established to the pressure range under which there would be substantially no vapor phase reaction.

Usually, each of the reactant gas molecules has a size (diameter D) of several angstroms (Å) and the shortest distance between the wafer and the inner wall of the vacuum vessel is generally several centimeters (cm). By setting the pressure within the vacuum vessel 1 to the order of $1\times10^{-3}$ Torr, it is possible to meet the requirements as specified by the equation (1) where no vapor phase reaction occurs.

Even for the reactant gas that contains a mixture of several different gases, the mean free path for the molecules in each of those gases may be several centimeters (cm) or more if the pressure as a whole is equal to $1\times10^{-3}$ Torr or less.

The description that has been made so far considers the probability of the reactant gas molecules striking against the wafer and/or the inner wall, and the probability of molecules collided each other. Macroscopically, if the reactant gas has a very small thermal conduction when it is in its vapor phase, the thermal energy cannot conduct evenly through the gas in the vapor phase, meaning that substantially no vapor reaction can occur. In fact, the inventors of the present invention verified that no vapor phase reaction could occur when an attempt was made to maintain the vacuum vessel into which $Si_2H_6$ gas was supplied from the apparatus of FIG. 1 under the pressure of the order of $1.5 \times 10^{-2}$ Torr.

This way verified by allowing Si to selectively grow on a wafer whose surface has been patterned (as disclosed in the co-pending Japanese application No. 2-253004). The selective epitaxial film obtained during the above process was found to be greater in thickness than the selective epitaxial film as reported in recannelli et al. (Appl. Phy. Lett. 58 (19), May 13, 1991, P. 2096-P. 2098 "Low-temperature selective epitaxy by ultra-high vacuum chemical vapor deposition from $SiH_4$ and $GeH_4/H_2$). This was presumably because the reactant gas did not discompose in the vapor phase, and the selectively was not affected.

This was also presumably because the $Si_2H_6$ gas molecules had the thermal conduction which was sufficiently small at $1.5 \times 10^{-2}$ Torr. This reason may be explained by the fact that even if it should become more probable that the molecules given the thermal energy collide each other, there would occur substantially no vapor phase reaction unless the thermal energy would be distributed evenly over the total reactant gas in the vapor phase.

Then, an attempt was made to verify that the relationships between the temperature of $Si_2H_6$ gas molecules T vap, the temperature of the wafer T sub, and the temperature of the vacuum side-exposed wall T wall would satisfy the preceding equation (2).

Figure 6:
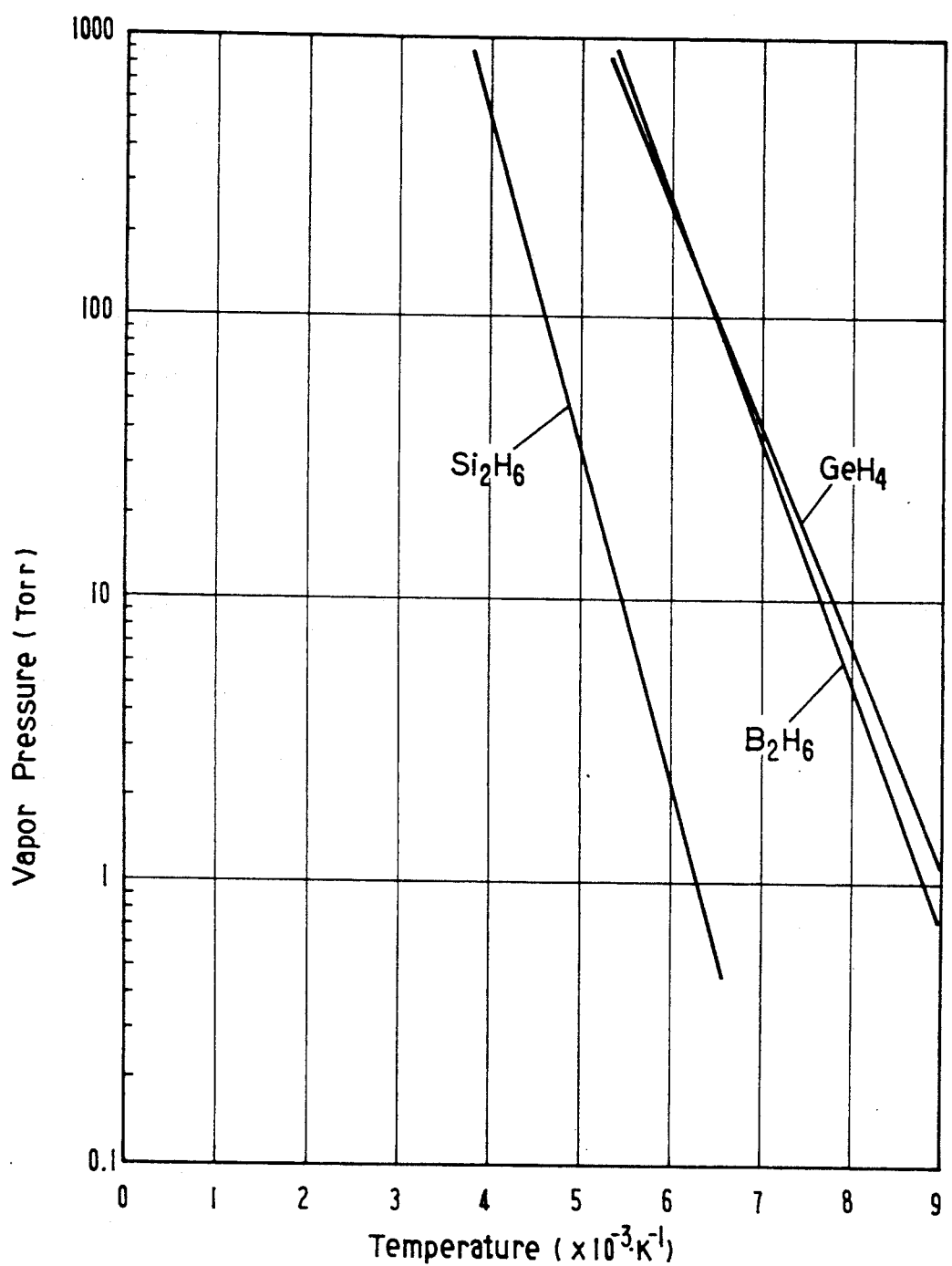
FIG. 6 is a graphical representation illustrating the relationships between the saturated vapor pressure and temperature of a reactant gas used in the embodiment of the present invention.

From the graphical curves in FIG. 6 showing the relation between the vapor pressure and temperature of $Si_2H_6$ gas (plotted against the data from "Handbook of Chemistry and Physics" published by the Chemical Rubber Co.) the Clausius Clapeyron equation (4) is derived as follows:

$$\log P = 7.56 - \frac{1.2 \times 10^3}{T} \quad (4)$$

where P is the vapor pressure (Torr), and T is the temperature (K).

For the water-cooled shroud, the pressure within the vacuum vessel 1 was equal to any value between about $6 \times 10^{-5}$ Torr and about $1.5 \times 10^{-3}$ Torr. The temperature T (T vap) may be obtained by substituting this value or the equation (4), as follows:

$$T\,vap = 102 \text{ to } 115\,(K)$$

Since the temperature of the wafer 9 was 700° C., or 973K, the temperature of the wall T wall must satisfy the following equation:

$$102 \text{ to } 115 < T\,wall < 973 \quad (5)$$

The water available from the utilities service is usually at the temperature range of 10° C. and 20° C., therefore T wall is equal to any value between 283 and 293K. The above equation (5) can be fully satisfied.

For the liquid nitrogen-cooled shroud, the pressure within the vacuum vessel was equal to any value between about $2 \times 10^{-6}$ Torr and about $5 \times 10^{-5}$ Torr. By substituting this value for the preceding equation (4), the result is as follows:

$$T\,vap = 90.5 \text{ to } 101.2$$

Thus, the temperature of the wall (T wall) must satisfy the following equation:

$$90.5 \text{ to } 101.2 < T\,wall < 973 \quad (6)$$

As the temperature of the shroud may be expected to be 77 to 80K when the liquid nitrogen is circulating, the value of T wall above does not satisfy the equation (6). In this case, T wall < T vap, therefore $Si_2H_6$ gas would be adsorbed by the liquid nitrogen-cooled shroud.

Figure 7:
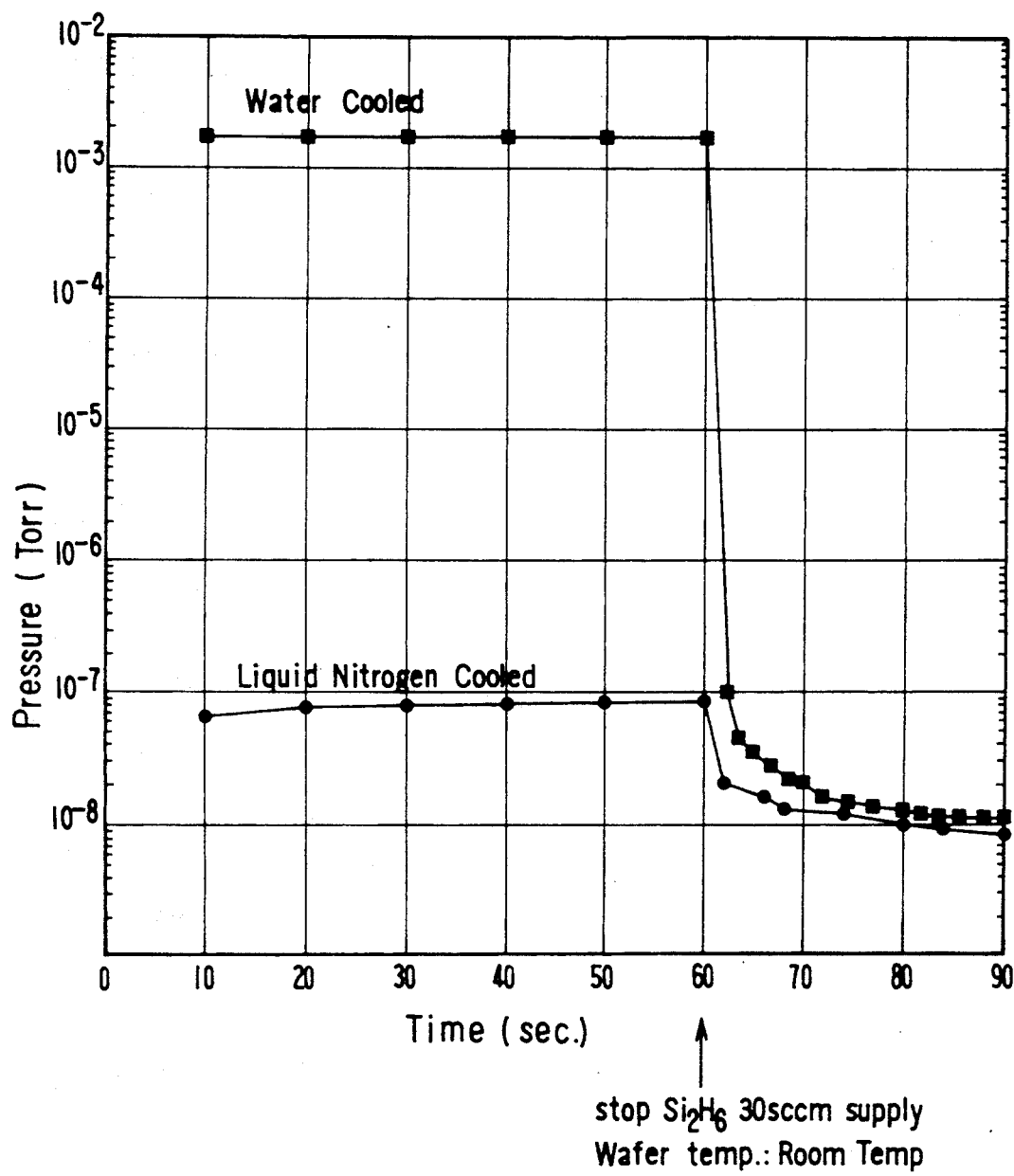
FIG. 7 is a graphical diagram illustrating how the pressures change when the supply of disilane gas is switched ON/OFF in the embodiment of the present invention.
Figure 8:
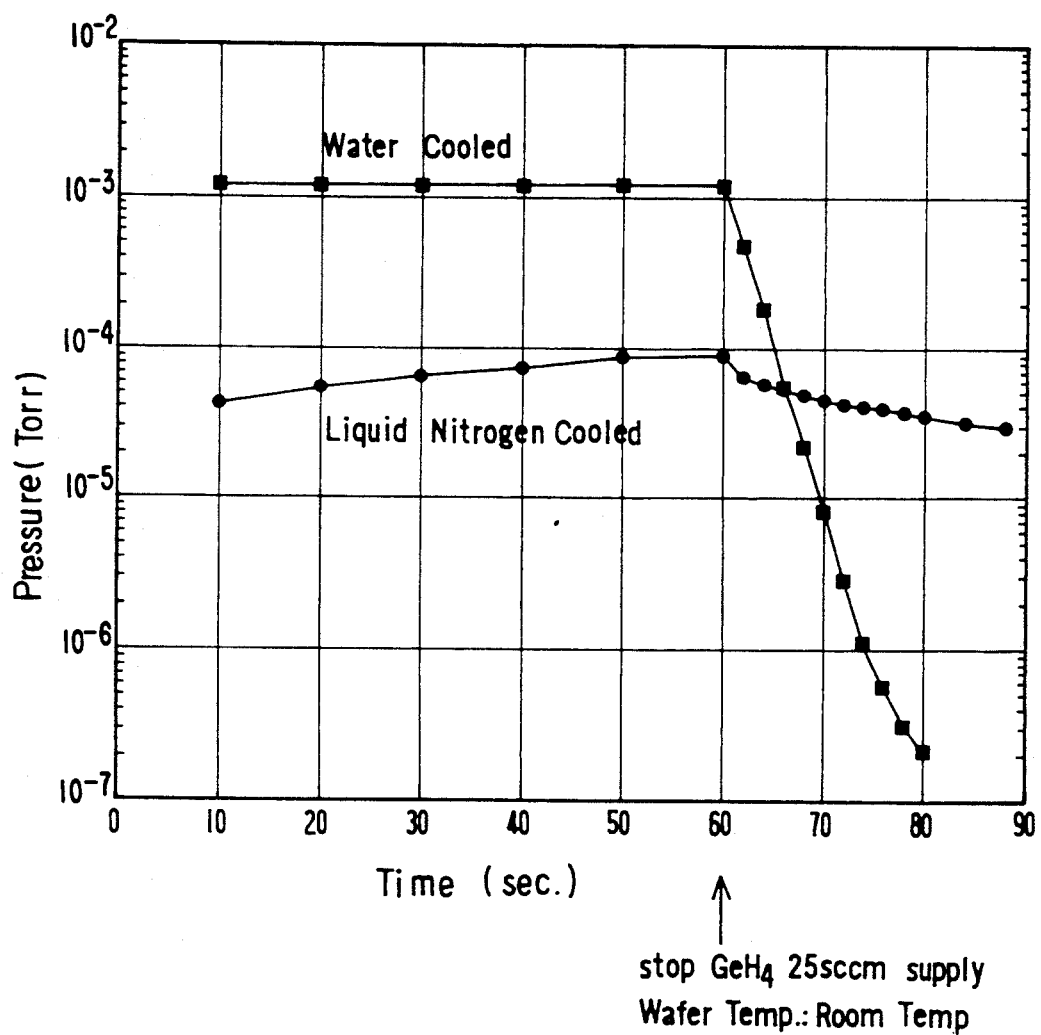
FIG. 8 is a graphical diagram illustrating how the pressures change when the supply of germanium hydride is switched ON/OFF in the embodiment of the present invention.

Investigation was made to check for the effect of any shortage of the reactant gas being supplied from the gas source (the response to any change in the pressure when the gas supply is cut). FIG. 7 shows the results obtained for the $Si_2H_6$ gas, and FIG. 8 shows the results for the $GeH_4$ (germanium hydride, simply known as germanium) gas. In both figures, there are shown the pressures under which a constant rate of gas is introduced into the vacuum vessel 1 while evacuation occurs at a constant rate, and the changes in the pressure when the gas supply is cut. For either gas, when the liquid nitrogen-cooled shroud (70 to 80K) is used, those gas molecules which have been adsorbed by the inner wall are leaving slowly from the inner wall again, so the gas cut-off characteristics is affected. For the water-cooled shroud (283 to 293K), however, the cut-off characteristics is much between for either gas. This is presumably because there are fewer gas molecules that have been adsorbed by the inner wall.

The pressure under which a constant rate of gas is delivered is found to be constant for the water-cooled shroud. This is also presumably because there are fewer gas molecules that have been adsorbed by the inner wall. For the liquid nitrogen-cooled shroud, it is found that a longer time is required until a constant pressure is reached. This is presumably because a large proportion of the supplied gas molecules are adsorbed by the inner wall, followed by leaving from the inner wall again, and a certain time is required until the equilibrium condition is reached following the adsorption and leaving, respectively.

It may be seen from the results in FIG. 7 and FIG. 8 that the gas cut-off can be improved by maintaining both the gas supply and evacuation rates constant, and by maintaining the inner wall at the appropriate temperature, so that any remaining gas can be evacuated at high speeds. As also seen from FIGS. 7 and 8, and improved system for depositing a thin film may be implemented. In FIG. 7, $Si_2H_6$ can be evacuated at the effective pumping speed of 500 liters/sec.

Figure 9:
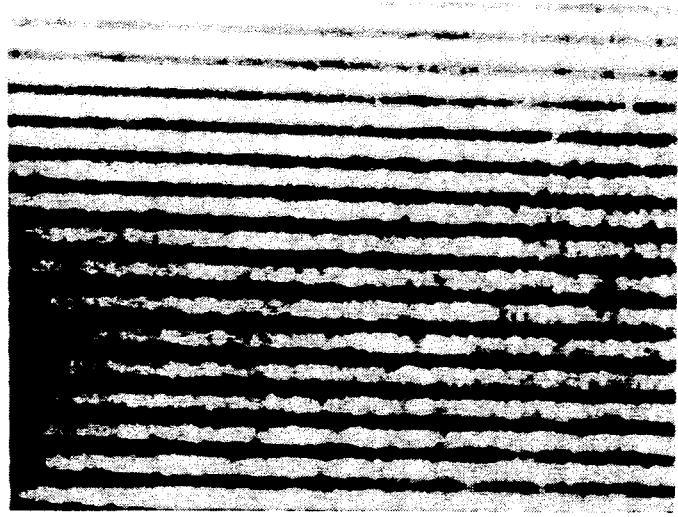
FIG. 9 is the cross sectional TEM image of Si and SiGe super lattice.
Figure 10:
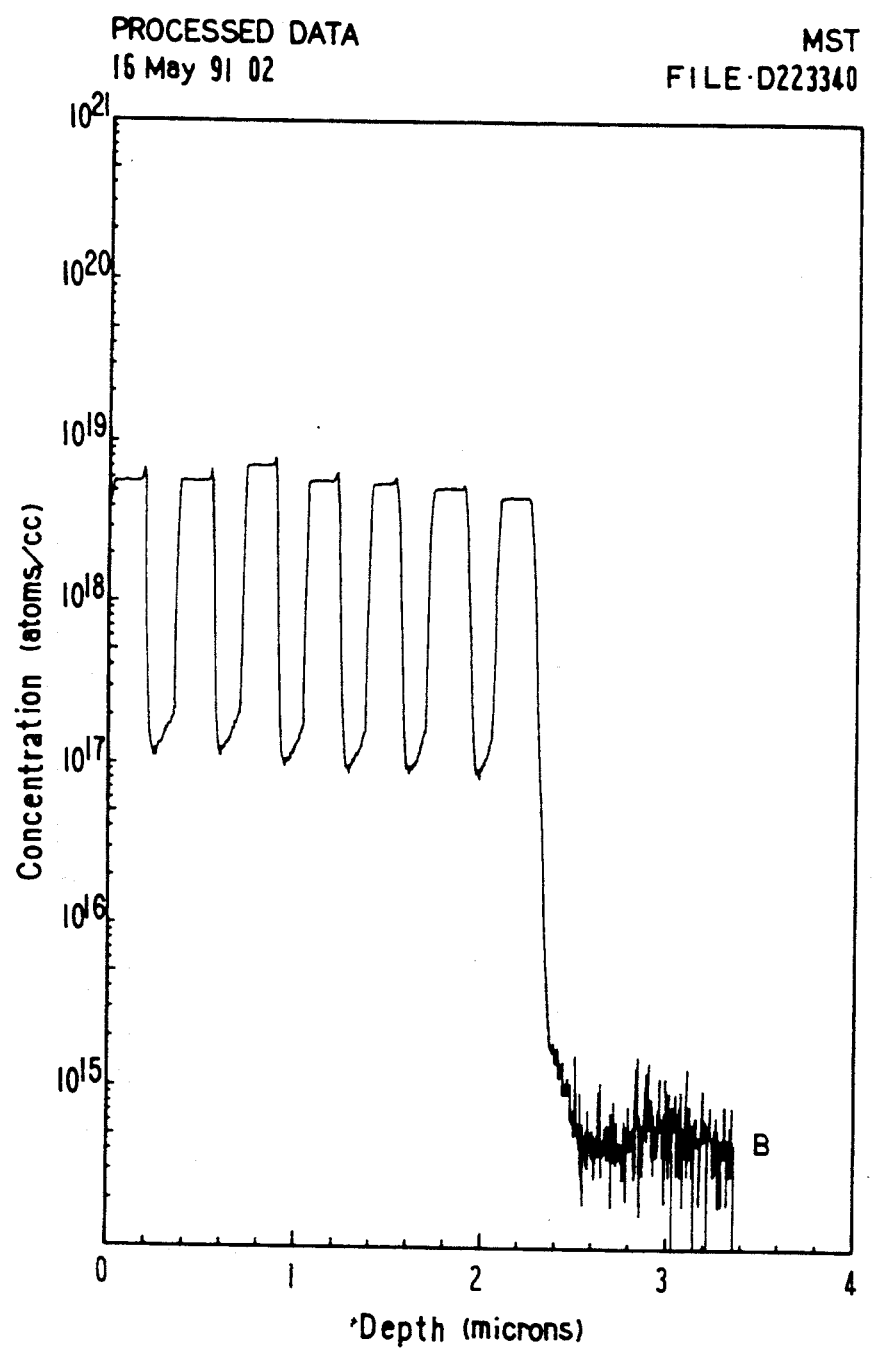
FIG. 10 is an SIMS-analyzed spectrum diagram for a film formed according to the particular embodiment, by supplying a hydrogen gas containing diborane ($B_2H_6$) gas at regular time intervals during the silicon epitaxial growth process.

The results of the actual thin film depositing may be seen in FIG. 9 and FIG. 10.

FIG. 9 shows the cross-section TEM image of superlattice made of Si and SiGe. The monocrystalline silicon is allowed to grow by supplying a flow of $Si_2H_6$ gas at a constant rate. The polycrystalline germanium/silicon is allowed to grow by supplying a flow of $GeH_4$ gas added to $Si_2H_6$ gas at the respective constant rates. A multilayer structure may be provided by repeating the supply of those reactant gases. It may be understood that an epitaxial film having a flat interface may be obtained simply by switching on and off the supply of the gases repeatedly.

Now, the requirements for depositing such an super-lattice structure are described below. When a monocrystalline silicon is allowed to grow, $Si_2H_6$ gas should be supplied at the flow rate of 6 sccm, and when a germanium/silicon is allowed to grow, $Si_2H_6$ gas should be supplied at the flow rate of 6 sccm and $GeH_4$ gas should be supplied at the flow rate of 4 sccm. The pressures under which those gases are supplied should be $3 \times 10^{-4}$ Torr for $Si_2H_6$ gas, and $5 \times 10^{-4}$ Torr for the mixture of $Si_2H_6$ and $GeH_4$ gases. The temperature of a wafer should be 580° C. and the temperature of the water-cooled shroud should be 10° C. Those temperatures should be maintained constant. Naturally, $GeH_4$ should satisfy the requirements as specified by the equation (2). The relationships between the respective vapor pressures and temperatures of the gases are shown graphically in FIG. 6. The shortest distance between the wafer and the vacuum side-exposed wall of the vacuum vessel should be 40 mm.

In the multilayer structure shown in FIG. 9, the dark part represents the germanium/silicon film, and the white part represents the silicon film. The germanium/silicon film has a thickness of about 70 Å, and the silicon film has a thickness of about 120 Å. A mixture of $Si_2H_6$ and $GeH_4$ gases is made to flow for twenty-three (23) seconds when the germanium/silicon is allowed to grow. Thus, the film growth rate is 3.0 Å/min. For the silicon growth, $Si_2H_6$ gas is made to flow for 174 seconds. Thus, the film growth rate is 0.7 Å/min.

This super-lattice, multilayer structure can be built was supplied at the rate of 20 sccm, and at the same time, dihydrodiborane ($B_2H_6$) gas which is diluted to 1% with hydrogen ($H_2$) by volume was supplied at the rate of 2 sccm at every 20 seconds during the period of 120 seconds. During that period, the pressure of $1 \times 10^{-4}$ Torr was maintained. The temperature of the water-cooled shroud was set to 10° C., and the shortest distance between the wafer 9 and the vacuum side-exposed wall (inner wall of the shroud 3) was set to about 40 mm.

$B_2H_6$ gas satisfies the equation (2), and the relationships between the vapor pressure and temperature of $B_2H_6$ are shown in FIG. 6. $H_2$ gas is the diluted gas of $B_2H_6$, and takes no part when $B_2H_6$ provides its decomposing reaction. The pressure of $Si_2H_6$ gas, and the pressure of the mixture of $B_2H_6$ gas and $H_2$ gas are equal to $1 \times 10^{-4}$ Torr, and so the partial pressure of $B_2H_6$ is below the above pressure (total pressure). It is therefore unnecessary to take into account the mean free path of the hydrogen gas.

The thickness of the crystalline silicon film containing a doped boron (B) was found to be 2000 Å, and the thickness of the monosilicon film was also found to be 2000 Å. It may be seen from FIG. 10 that is contains about $10^{19}$ B atoms per $cm^3$.

An attempt was made to deposit a similar thin film by varying the rate of $H_2$ gas containing 1% $B_2H_6$ by volume to be supplied. $Si_2H_6$ gas was supplied at the rate of 20 sccm, and at the same time $H_2$ gas containing 1% $B_2H_6$ by volume was added every 20 seconds during the period of 120 seconds for a total of eleven times. For each time, the hydrogen gas with $B_2H_6$ gas and the $B_2H_6$ gas were increased as shown in Table 1 below.

TABLE 1

| No. | 1 | 2 | 3 | 4 | 5 | 6 | 7 | 8 | 9 | 10 | 11 |
|---|---|---|---|---|---|---|---|---|---|---|---|
| Rate of $H_2$ gas with $B_2H_6$ (sccm) | 0.03 | 0.06 | 0.07 | 0.12 | 0.22 | 0.5 | 1.0 | 1.0 | 2.0 | 4.9 | 9.9 |
| Net $B_2H_6$ (sccm) | $0.03 \times 10^{-2}$ | $0.06 \times 10^{-2}$ | $0.07 \times 10^{-2}$ | $0.12 \times 10^{-2}$ | $0.22 \times 10^{-2}$ | $0.5 \times 10^{-2}$ | $1.0 \times 10^{-2}$ | $1.0 \times 10^{-2}$ | $2.0 \times 10^{-2}$ | $4.9 \times 10^{-2}$ | $9.92 \times 10^{-2}$ | because after the supply of the reactant gas (source gas) is cut off, any residual gas that remains in the vacuum vessel can be evacuated with the high speed, and the epitaxial growth that is then proceeding can be rapidly stopped. That is, no film growth due to any residual gas occurs any longer just after the gas supply is cut off. This means that if the film growth rate is known under certain conditions such as the supplied reactant gas rate, wafer temperature, etc., the thickness of the film being doposited can be controlled precisely simply by controlling the supplying period of time of the reactant gas to be supplied.

In the embodiment, the super-lattice, multilayer structure that contains silicon and germanium/silicon has been described. It should be understood, however, that any compound semiconductor film having the super-lattice, multilayer structure containing GaAs, GaAlAs, InP, and so on may be provided easily in the same manner as described, by making the appropriate selection of any reactant gas.

FIG. 10 shows the results obtained by analyzing the profile of the epitaxial growth silicon film on the wafer in its depth direction by using the SIMS (Secondary Ion Mass Spectrometry) technique. Those results were obtained under the particular conditions under which the temperature of the wafer was set to 680° C., $SiH_6$ gas The temperature of the wafer was set to 680° C., and the temperature of the water-cooled shroud was set to 10° C. The pressure under which a thin film was being deposited was equal to $1 \times 10^{-3}$ Torr. The shortest distance between the wafer 9 and the vacuum side-exposed wall (inner wall of the shroud 3) was 40 mm. The rates of the $H_2$ gas containing $B_2H_6$ were the same for the 7th and 8th times because the mass flow controller 14 was changed to a greater capacity controller at the 8th and subsequent times.

Figure 11:
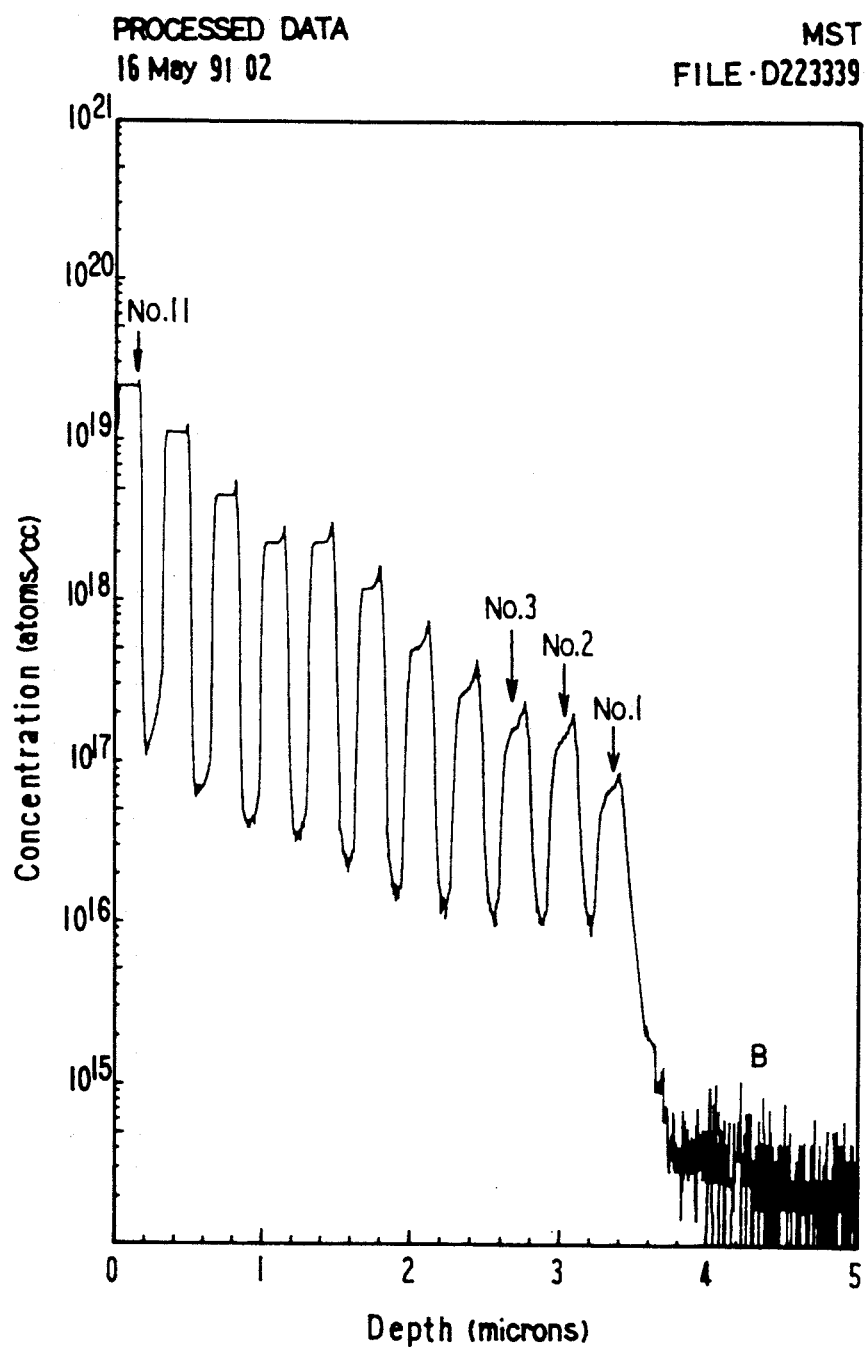
FIG. 11 is an SIMS-analyzed spectrum diagram for a film formed according to the particular embodiment, by varying the rate of the supplied hydrogen gas containing diborane gas to cause variations in the doping density of boron atoms.

The results obtained by analyzing the deposited film by the SIMS technique is shown in FIG. 11. As it may be seen from FIG. 11, the film shows the concentration gradient of the doped atoms. The B atoms presents the maximum doping concentration near the surface of the film, and it presents the minimum doping concentration near the base interface. The B atoms present the doping concentration that is decreasing from the surface toward the base interface. This means that if the rate of $B_2H_6$ to be supplied is varied successively as the time goes on, the doping concentration of the B atoms may be varied successively accordingly.

Figure 12:
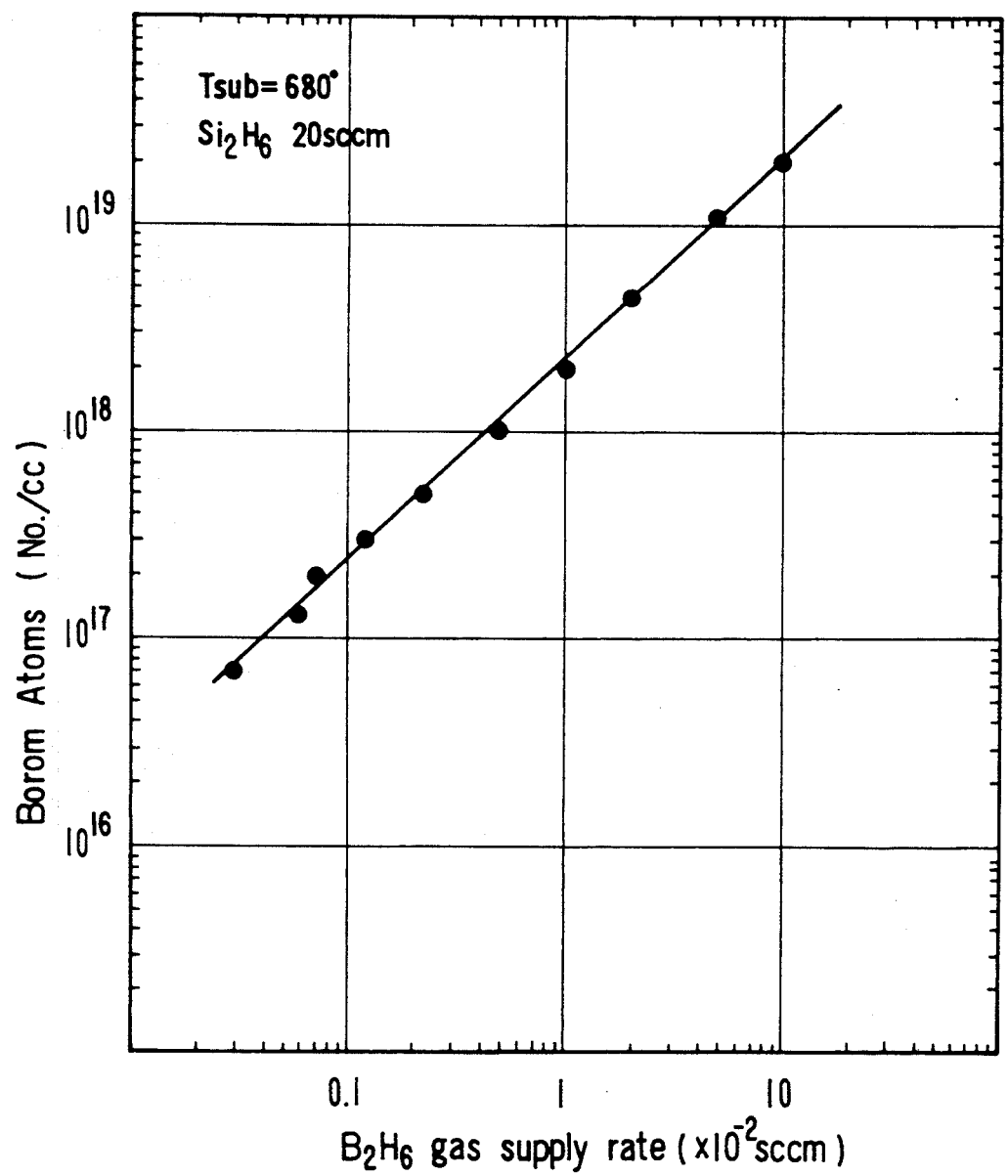
FIG. 12 is a graphical representation illustrating the relationships between the rate of the supplied hydrogen gas containing diborane gas and the number of boron atoms in the deposited film.

FIG. 12 shows the relationships between the rate of $B_2H_6$ being supplied and the doping concentration of the B atoms, which are based upon the results in FIG.

11. It may be seen from FIG. 12 that the B atom dopes vary in proportion to the rate of $B_2H_6$ gas.

In the embodiment, the B atoms will have their doping concentration increasing as it is nearer to the wafer surface, that is, as the film deposition progesses. Conversely, it may be possible that the doping concentration is decreasing as it is nearer to the wafer surface. It may also be possible that the doping concentration is ether the maximum or the minimum in the middle of the film. The doping atom, which is B atom in this case, may be P (phosphor) atom instead. The P atoms may have the doping concentration gradient as desired.

The method that has been described may be used to fabricate a high-speed bipolar transistor element capable of high-speed switching operation on a wafer, in such a way that any impurity substance may be doped at the base region of the bipolar transistor with the appropriate concentration gradient.

The following provides the results obtained by examining the relationships that exist between the temperature of the wafer and the doping quantity of the B atoms. The examination was conducted by supplying $Si_2H_6$ gas at the rate of 29 sccm, and by supplying $H_2$ gas containing 1% $B_2H_6$ gas by volume at the rate of 3.6 sccm, during the periods of time as specified in Table 2. For the first time, $Si_2H_6$ gas was supplied for 40 seconds, and then a mixture of $Si_2H_6$ gas and $H_2$ gas containing 1% $B_2H_6$ gas was supplied for 40 seconds.

TABLE 2

| No. | 1 | | 2 | | 3 | | 4 | | 5 | |
|---|---|---|---|---|---|---|---|---|---|---|
| Temp. of Wafer (°C.) | 715 | | 700 | | 687 | | 650 | | 638 | |
| Supply Time of $Si_2H_6$ (sec) | 40 | 40 | 50 | 50 | 60 | 60 | 120 | 120 | 180 | 180 |
| Supply Time of $B_2H_6$ (sec) | 0 | 40 | 0 | 50 | 0 | 60 | 0 | 120 | 0 | 180 |

In the above table, the film was doped B atoms was deposited to a thickness of about 100 Å.

Figure 13:
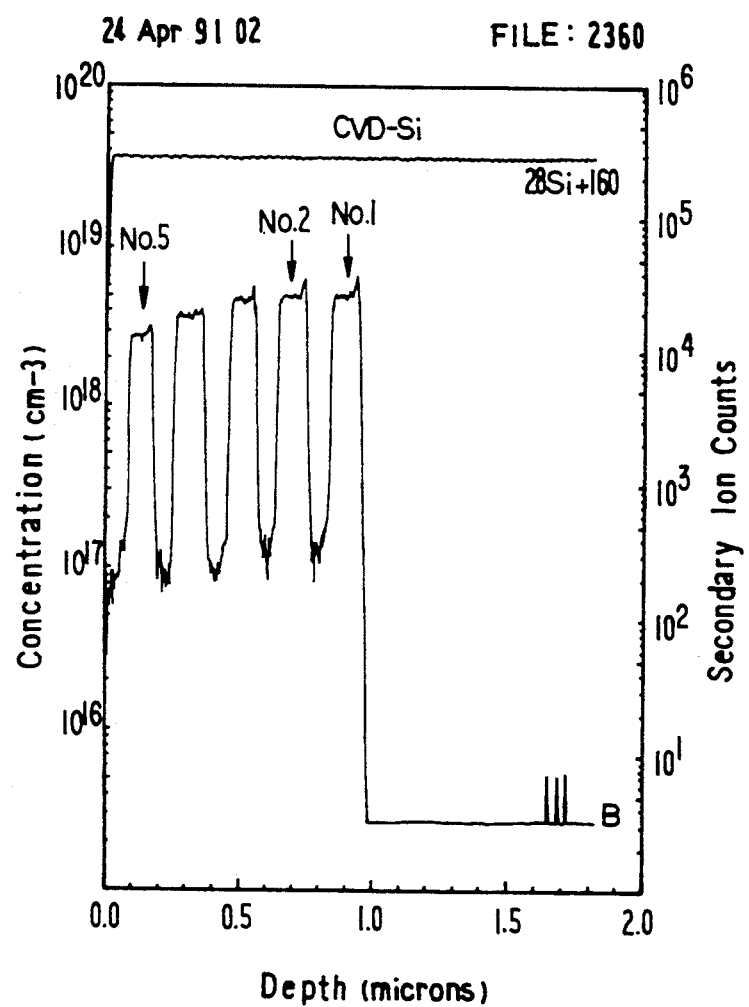
FIG. 13 is an SIMS-analyzed spectrum diagram for a film formed according to the particular embodiment, by varying the temperature of the wafer while boron atoms are being doped.

The results obtained by the SIMS analysis on the thin films deposited are shown in FIG. 13. It is found that each thin film contains 3 or $4 \times 10^{18}$ per $cm^3$ of doped B atoms. From this, it is clear that the amount of B atoms to be doped does not depend largely on the temperature of the wafer.

In all of the preferred embodiments that have been described so far, water circulates through the shroud 3 to control the temperature of the vacuum side-exposed wall. It should be understood that any other fluid that can control the temperature without trapping the reactant gas being supplied may be used instead of water. Furthermore, any combination of the reactant gases to be supplied and the fluids to circulate through the shroud maybe used, depending upon the particulate needs.

It may be appreciated from the foregoing description that according to the present invention, the reactant gas molecules supplied into the vacuum vessel can be diffused without being adsorbed by the inner wall of the vacuum vessel, thereby improving the utilization of the reactant gas, thus increasing the epitaxial growth. The method according to the present invention allows a film thickness uniformly to be distributed into the wafer without the need of rotating the wafer.

Furthermore, the present invention provides the precise controls for the thickness of a thin film being deposited during the epitaxial growth process, as well as the precise control for the concentration of any impurity atoms to be doped, by switching on and off the supply of the reactant gas.

Those precise controls for the thin film thickness and doping concentration according to the present invention may be applied to the manufacture of any bipolar transistor elements having base regions, whereby a thin film may be as thin as possible and then any impurity atoms may be doped into the base region with the appropriate doping concentration gradient. Also, it is easy to change the composition ratio x of $Si_{1-x}Ge_x$ gradually in the SiGe thin film. Therefore, by using the method of the present invention, a high-speed bipolar transistor element that is capable of high-speed switching operation can be fabricated.

In the conventional CVD thin film deposition process, the pressures are set to the viscous flow range above 1 Torr, and the vapor phase reaction is used positively. According to the present invention, however, the pressures are set to the molecule flow range below $10^{-2}$ Torr, and the vapor phase reaction can only occur on the wafer surface. Thus, the method according to the present invention implements the conceptual design completely differently from the CVD thin film deposition implemention.

Although the present invention has been described with reference to the several preferred embodiments thereof, it should be understood that various changes and modifications may be made without departing from the spirit and scope of the invention as defined in the appended claims.

What is claimed is:

1. In a thin film deposition method which includes depositing a thin film on a wafer surface by supplying reactant gas molecules toward and onto the wafer within a vacuum vessel or chamber, the improvement which comprises:

(i) evacuating the vacuum vessel or chamber until the pressure within the vacuum vessel or chamber reaches a predetermined vacuum pressure range;

(ii) supplying a reactant gas containing at least one kind of molecule into the vacuum vessel;

(iii) setting the pressure within the vacuum vessel to a pressure under which the mean free path "d" of the molecules contained in the reactant gas being supplied can be longer than the shortest distance "L" between the wafer and the wall of the vacuum vessel or chamber exposed to the vacuum side, or $d > L$;

(iv) setting the temperature of the wafer (T sub) to a temperature at which the reactant gas being supplied can substantially cause a thermal decomposition reaction; and (v) setting the temperature of the vacuum side-exposed wall of the vacuum vessel or chamber (T wall) to a temperature range having the lower limit higher than the temperature (T vap) at which a saturated vapor pressure can be maintained at the same value as the partial pressure of the molecules contained in the reactant gas as set in step (iii), and the upper limit lower than the temperature of the wafer (T sub), or $T\ vap < T\ wall < T\ sub$.

2. The thin film deposition method as defined in claim 1, wherein the thin film being deposited on the wafer surface is a thin film being deposited by the epitaxial growth.

3. The thin film deposition method as defined in claims 1 or 2, wherein the reactant gas being supplied is Si$_2$H$_6$ gas, and wherein the thin film being deposited on the wafer surface is an epitaxial silicon film.

4. The thin film deposition method as defined in claim 1, wherein the pressure within the vacuum vessel or chamber is maintained to about $1.5 \times 10^{-2}$ Torr after the reactant gas has been supplied into the vacuum vessel or chamber.

5. The thin film deposition method as defined in claim 1, wherein the temperature of the vacuum side-exposed wall of the vacuum vessel or chamber (T wall) is about 10° C.

6. The thin film deposition method as defined in claim 1, wherein the vacuum side-exposed wall is a shroud mounted inside the vacuum vessel or chamber, said shroud being maintained to a specific temperature by circulating water therethrough.

7. The thin film deposition method as defined in claim 1, wherein the pressure within the vacuum vessel or chamber as set in step (i) is $2 \times 10^{-9}$ Torr.

8. The thin film deposition method as defined in claim 1, wherein the pressure within the vacuum vessel or chamber as set in step (i) is established during the backing process for the vacuum vessel or chamber.

9. In a thin film deposition method which includes depositing a thin film on a wafer surface by supplying a reactant gas molecules toward and onto the wafer within a vacuum vessel or chamber, the improvement which comprises:
   (i) evacuating the vacuum vessel or chamber until the pressure within the vacuum vessel or chamber reaches a predetermined vacuum pressure range;
   (ii) supplying a reactant gas containing at least one kind of molecule into the vacuum vessel;
   (iii) setting the pressure within the vacuum vessel to a pressure under which the mean free path "d" of the molecules contained in the reactant gas being supplied can be longer than the shortest distance "L" between the wafer and the wall of the vacuum vessel or chamber exposed to the vacuum side, or $d > L$;
   (iv) setting the temperature of the wafer (T sub) to a temperature at which the reactant gas being supplied can substantially cause a thermal decomposition reaction; and
   (v) setting the temperature of the vacuum side-exposed wall of the vacuum vessel or chamber (T wall) to a temperature range having the lower limit higher than the temperature (T vap) at which a saturated vapor pressure can be maintained at the same value as the partial pressure of the molecules contained in the reactant gas as set in step (iii), and the upper limit lower than the temperature of the wafer (T sub), or T vap $<$ T wall $<$ T sub, and stopping the reactant gas being supplied at the moment that a thin film being deposited on the wafer reaches a thickness as required after a specific period of time has elapsed.

10. In a thin film deposition method which includes depositing a thin film on a wafer surface by supplying a reactant gas molecules toward and onto the wafer within a vacuum vessel or chamber, the improvement which comprises:
   (i) evacuating the vacuum vessel or chamber until the pressure within the vacuum vessel or chamber reaches a predetermined vacuum pressure range;
   (ii) supplying a reactant gas containing at least one kind of molecule into the vacuum vessel;
   (iii) setting the pressure within the vacuum vessel to a pressure under which the mean free path "d" of the molecules contained in the reactant gas being supplied can be longer than the shortest distance "L" between the wafer and the wall of the vacuum vessel or chamber exposed to the vacuum side, or $d > L$;
   (iv) setting the temperature of the wafer (T sub) to a temperature at which the reactant gas being supplied can substantially cause a thermal decomposition reaction;
   (v) setting the temperature of the vacuum side-exposed wall of the vacuum vessel or chamber (T wall) to a temperature range having the lower limit higher than the temperature (T vap) at which a saturated vapor pressure can be maintained at the same value as the partial pressure of the molecules contained in the reactant gas as set in step (iii), and the upper limit lower than the temperature of the wafer (T sub), or T vap $<$ T wall $<$ T sub;
   (vi) stopping the reactant gas being supplied in step (ii) at the moment that a thin film has reached a thickness as required, and supplying a reactant gas containing a different kind of molecule from those contained in the reactant gas supplied in step (ii);
   (vii) setting the pressure within the vacuum vessel to a pressure under which the mean free path "d" of the molecules contained in the reactant gas being supplied in step (vi) can be longer than the shortest distance "L" between the wafer and the wall of the vacuum vessel or chamber exposed to the vacuum side, or $d > L$;
   (viii) setting the temperature of the wafer (T sub) to a temperature at which the reactant gas being supplied in step (vi) can substantially cause a thermal decomposition reaction;
   (ix) setting the temperature of the vacuum side-exposed wall of the vacuum vessel or chamber (T wall) to a temperature range having the lower limit higher than the temperature (T vap) at which a saturated vapor pressure can be maintained to the same value as the partial pressure of the molecules contained in the reactant gas as set in step (vii), and the upper limit lower than the temperature of the wafer (T sub), or T vap $<$ T wall $<$ T sub;
   (x) stopping the reactant gas being supplied in step (vi) at the moment that a thin film has reached a thickness as required.

11. The thin film deposition method as defined in claim 10, wherein the steps (ii) through (x) are repeated.

12. The thin film deposition method as defined in claims 10 or 11, wherein the pressures being set in steps (iii) and (vii) are less than about $1.5 \times 10^{-2}$ Torr.

13. The thin film deposition method as defined in claims 10 or 11, wherein the temperature of the vacuum side-exposed wall (T wall) being set in steps (v) and (ix) are about 10° C.

14. The thin film deposition method as defined in claims 10 or 11, wherein the thin film being deposited on the wafer in steps (ii) through (v) are thin films being deposited by the epitaxial growth.

15. The thin film deposition method as defined in claims 10 or 11, wherein the thin films being deposited on the wafer in steps (vi) through (x) are polycrystalline thin films.

16. The thin film deposition method as defined in claims 10 or 11, wherein the thin films being deposited on the wafer in steps (vi) through (x) are thin films containing impurities.

17. The thin film deposition method as defined in claims 10 or 11, wherein the reactant gas being supplied in step (ii) is $Si_2H_6$ gas, and wherein the reactant gas being supplied in step (vi) is a mixture of $Si_2H_6$ gas and $B_2H_6$ gas.

18. The thin film deposition method as defined in claims 10 or 11, wherein the reactant gas being supplied in step (ii) is $Si_2H_6$ gas, and wherein the reactant gas being supplied in step (vi) is a mixture of $Si_2H_6$ gas and $H_2$ gas containing $B_2H_6$ gas.

19. The thin film deposition method as defined in claim 14, wherein the reactant gas being supplied in step (ii) is $Si_2H_6$ gas, and wherein a thin film being deposited on the wafer is an epitaxial Si thin film.

20. The thin film deposition method as defined in claim 15, wherein the reactant gas being supplied in step (vi) is a mixture of $Si_2H_6$ gas and $GeH_4$, and wherein a thin film being deposited on the wafer is a Ge/Si thin film.

21. The thin film deposition method as defined in claims 10 or 11, wherein the reactant gas being supplied in step (vi) is a mixture of $Si_2H_6$ gas and $H_2$ gas containing $B_2H_6$ gas, and wherein the thin film being deposited on the wafer is an epitaxial si thin film containing B atoms as an impurity.

22. The thin film deposition method as defined in claim 11, wherein the steps (ii) through (vi) are repeated, and wherein the rate of the reactant gas being supplied in step (vi) is varied for each repetition.

23. The thin film deposition method as defined in claim 22, wherein the reactant gas being supplied in step (vi) is a mixture of $Si_2H_6$ gas and $H_2$ gas containing $B_2H_6$ gas, and wherein the rate of $H_2$ gas containing $B_2H_6$ gas being supplied is increased or decreased for each repetition.

24. The thin film deposition method as defined in claim 23, wherein the thin film being deposited on the wafer is an epitaxial Si thin film containing B atoms having a concentration gradient.

25. The thin film deposition method as defined in claims 10 or 11, wherein the thin film being deposited on the wafer is a thin film having a super-lattice structure.

26. The thin film deposition method as defined in claim 25, wherein the super-lattice structure includes a multilayer structure containing an epitaxial Si thin film and a Ge/Si thin film.

27. The thin film deposition method as defined in claims 10 or 11, wherein the vacuum side-exposed wall is a shroud mounted inside the vacuum vessel or chamber, and wherein the shroud is maintained to a constant temperature by circulating water therethrough.

28. The thin film deposition method as defined in claims 10 or 11, wherein the pressure being set in step (i) is established during the baking process for the vacuum vessel or chamber while it is being evacuated.

* * * * *